US007603814B1

(12) United States Patent
Hartmann et al.

(10) Patent No.: US 7,603,814 B1
(45) Date of Patent: Oct. 20, 2009

(54) DECKING SYSTEM HANGER

(75) Inventors: Daniel L. Hartmann, Butler, PA (US); Thomas G. Ryan, North Huntingdon, PA (US)

(73) Assignee: Epic Metals Corporation, Rankin, PA (US)

( * ) Notice: Subject to any disclaimer, the term of this patent is extended or adjusted under 35 U.S.C. 154(b) by 737 days.

(21) Appl. No.: 10/857,537

(22) Filed: May 28, 2004

(51) Int. Cl.
*G09F 7/18* (2006.01)
*E04H 14/00* (2006.01)
*H05K 7/14* (2006.01)
*F16B 2/02* (2006.01)

(52) U.S. Cl. ............................... 52/39; 52/27; 248/339; 24/569

(58) Field of Classification Search ..................... 52/39, 52/28, 27, 705; 248/317, 339; 24/514, 525, 24/569; 362/150, 148, 147
See application file for complete search history.

(56) References Cited

U.S. PATENT DOCUMENTS

| | | | | | |
|---|---|---|---|---|---|
| 2,824,913 | A | * | 2/1958 | Taylor | 191/43 |
| 2,852,830 | A | * | 9/1958 | Lloyd et. al. | 403/345 |
| 2,919,879 | A | | 1/1960 | Hume | |
| 3,874,035 | A | * | 4/1975 | Schuplin | 248/72 |
| 3,921,356 | A | | 11/1975 | Hughes | |
| 4,025,019 | A | | 5/1977 | Jacobsen et al. | |
| 4,135,692 | A | | 1/1979 | Ferguson | |
| 4,400,922 | A | * | 8/1983 | Boyer | 52/394 |
| 4,511,211 | A | | 4/1985 | Runyan | |
| 4,564,165 | A | | 1/1986 | Grant et al. | |
| 4,787,587 | A | | 11/1988 | Deming | |
| 5,423,507 | A | * | 6/1995 | Florent et al. | 248/300 |
| 5,667,181 | A | * | 9/1997 | van Leeuwen et al. | 248/343 |
| 5,713,157 | A | | 2/1998 | Van Leeuwen et al. | |
| 2002/0060280 | A1 | | 5/2002 | Yaphe et al. | |

FOREIGN PATENT DOCUMENTS

JP 406212724 A * 8/1994 .............. 52/506.06

OTHER PUBLICATIONS

Epic Metals Corporations, "A Study of the Epicore Composite Floor System in Hospital Construction," Mar. 12, 1996, pp. 1-2.
Epic Metals Corporation, "Composite Floor Decks," © 1981, pp. 1-2.

* cited by examiner

*Primary Examiner*—Brian E Glessner
*Assistant Examiner*—Andriana Figueroa
(74) *Attorney, Agent, or Firm*—The Webb Law Firm

(57) ABSTRACT

A hanger for attaching a load-bearing object to a rib includes a gripper having a gripper body, the gripper body having a plurality of tabs depending therefrom; a cradle having a cradle body, the cradle body defining a gripper body receiving recess for receiving the gripper body, the gripper body received within the gripper body receiving recess; a fastener passing through the cradle body and the gripper body; and a stop threadably secured to the fastener, wherein the cradle is positioned between the gripper and the stop, the fastener coacting with the gripper and the cradle, whereby movement of the stop in a first direction causes the cradle body to coact with the gripper body causing the plurality of tabs to move toward each other. A kit for assembling the hanger and a hanger system utilizing the hanger are also disclosed.

33 Claims, 5 Drawing Sheets

DECKING SYSTEM HANGER

BACKGROUND OF THE INVENTION

1. Field of the Invention

This invention relates to a hanger system for a roof and, in particular, a hanger for supporting a load-bearing object to a metal decking assembly.

2. Description of Related Art

Airport terminals, arenas, convention centers, gymnasiums, office buildings, and other major structures normally must provide for the economical handling of noise control. One way to accomplish this is to form metal roof panels into acoustical ceiling roof panel assemblies to meet the necessary noise reduction coefficients. Metal decking assemblies and, more particularly, acoustical roof panel assemblies, must have efficient sound-absorbing properties, superior thermal insulation values, and structural integrity. To this end, conventional acoustical decking consists of a metal panel including alternating flats and ribs of approximately the same width, as shown in the prior art depicted in FIG. 1. This type of construction is conducive to supporting a load-bearing object from the metal decking assembly. Specifically, an internal hollow rib chamber 2 in each rib 4 allows a prior art wedge nut hanger 6 to be received therein. A hanging rod 8 may be attached to the wedge nut hanger, whereupon the load-bearing object may be supported.

There are various styles of metal decking assemblies that do not utilize the internal hollow rib chamber due to design and construction differences relating to the purpose and aesthetic nature of the particular metal decking assembly. For example, a metal decking assembly may be designed that utilizes an external hollow rib chamber. Accordingly, what is needed and has not heretofore been developed is a hanger and hanger system which incorporate a metal decking assembly and provide for a means of attaching a load-bearing object to the external hollow rib chamber of the metal decking assembly. Such a hanger and hanger system would be easy to install, provide sufficient support for the load-bearing object secured thereto, and would be in keeping with the overall aesthetic design of the metal decking assembly.

SUMMARY OF THE INVENTION

The foregoing need for a hanger system and hanger for attaching a load-bearing object to a metal decking assembly utilizing an external hollow rib chamber is addressed in the present invention.

The hanger for attaching a load-bearing object to the rib of the roof includes a gripper having a gripper body, wherein the gripper body has a plurality of tabs depending therefrom. The hanger also includes a cradle having a cradle body, wherein the cradle body defines a gripper body receiving recess for receiving the gripper body. Furthermore, the hanger includes a threaded fastener passing through the cradle body and the gripper body. The threaded fastener may also be an all-thread. A stop is threadably secured to the threaded fastener, wherein the cradle is positioned between the gripper and the stop, and the fastener coacts with the gripper and the cradle. A method of attaching the load-bearing object to the rib of the roof includes providing a roof having an external member extending downwardly therefrom with the external member having a profiled surface. The hanger is positioned near the external member so that the plurality of tabs is proximate to the profiled surface of the external member. Moving the stop in a first direction causes the cradle body to deform the gripper body and causes the plurality of tabs to move toward each other and securely engage the profiled surface of the external member. The load-bearing object may then be attached to the hanger. The hanger may be easily repositioned along the profiled surface of the external member. Alternatively, the hanger may be completely removed from the external member to be reused on an external member at a different locale. The hanger may also include ties secured around the cradle body for use in aligning the hanger with the rib.

These and other advantages of the present invention will be understood from the description of the preferred embodiments, taken with the accompanying drawings, wherein like reference numerals represent like elements throughout.

DESCRIPTION OF THE PREFERRED EMBODIMENTS

Figure 1:
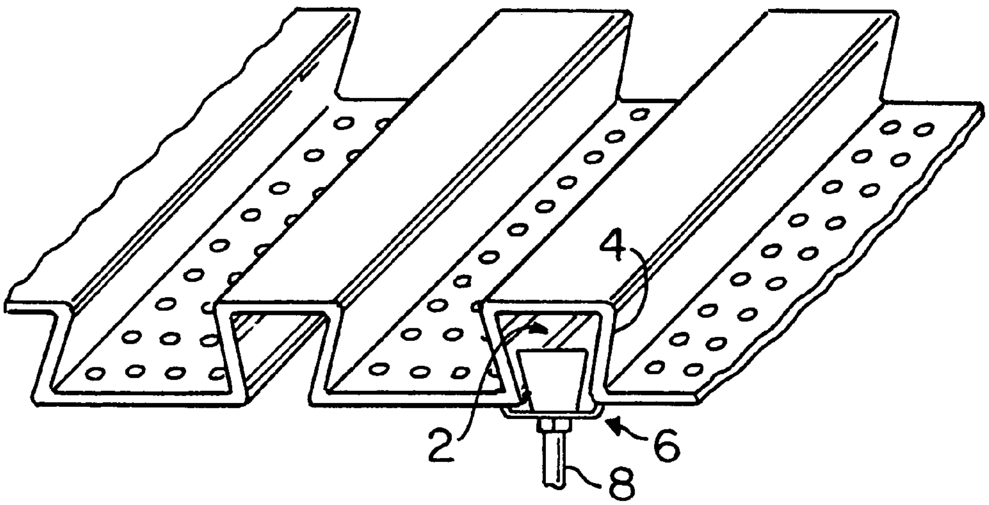
FIG. 1 PRIOR ART
FIG. 1 is a perspective view of a portion of a prior art metal decking assembly illustrating a wedge nut hanger secured within an internal hollow rib chamber.
Figure 2:
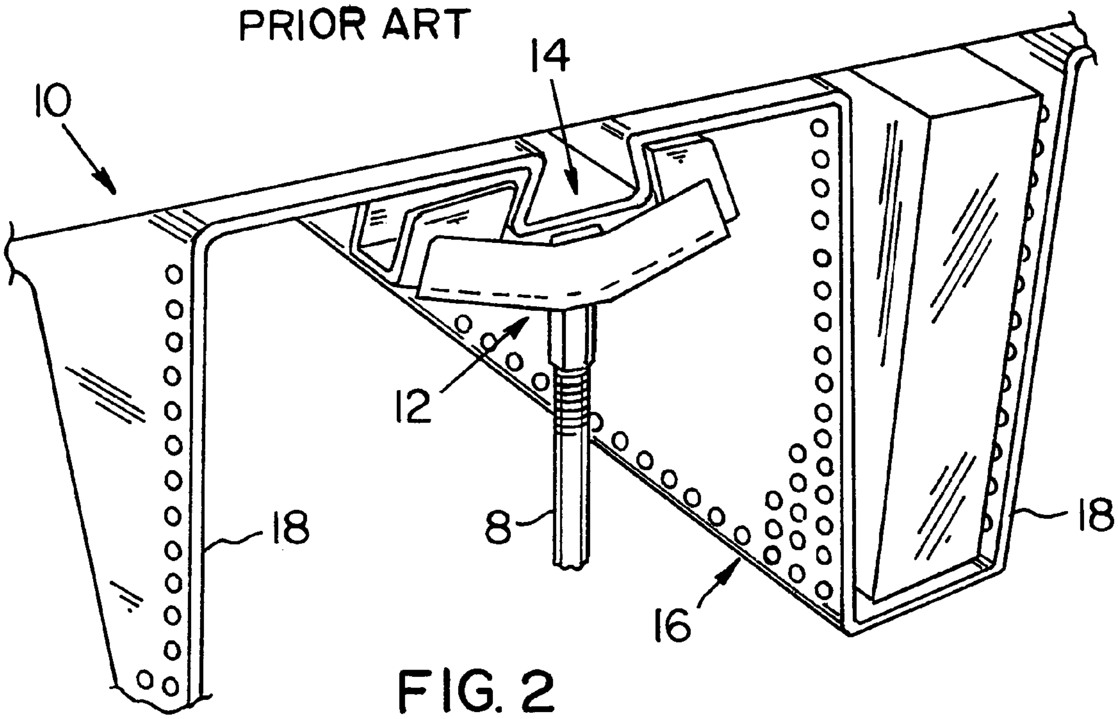
FIG. 2 is a perspective view of a metal decking assembly with an external hollow rib chamber for securing a hanger made in accordance with the present invention.

A hanger system 10 according to the present invention is illustrated in FIGS. 2-9. As depicted in FIG. 2, the hanger system 10 includes a hanger 12 securely attached to an external hollow rib 14 of a metal decking assembly 16.

Figure 10A:
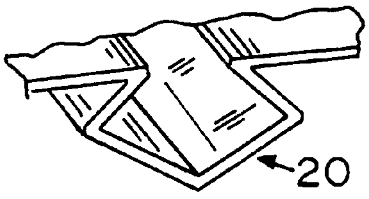
FIGS. 10*a* and 10*b* are perspective views of an angled rib and an arcuate-shaped external hollow rib, respectively.
Figure 10B:
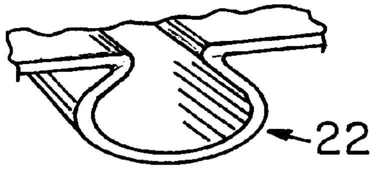

The metal decking assembly 16 may be of any type of construction that includes one or more external hollow ribs 14 extending therefrom. Thus, the external hollow rib 14 may be integrated into the metal decking assembly 16 so as to provide an aesthetic appearance while allowing the metal decking assembly 16 to maintain the necessary structural support. For example, FIG. 2 illustrates how the external hollow rib 14 is situated between the vertical standing acoustical elements 18, providing a visually bold ribbed ceiling appearance while allowing the metal decking assembly 16 to support a load-bearing object. The external hollow rib 14 has a keystone shape, wherein the external hollow rib 14 extends from a narrow width at the top to a wider width at the bottom. It is to be understood that the metal decking assembly 16 may utilize variously profiled external hollow ribs 14, such as an angled rib 20 and an arcuate-shaped rib 22, shown in FIGS. 10*a* and 10*b*. The profiled external hollow rib 14 has a recessed portion formed by adhering to a shape convention wherein the top of the external hollow rib 14 is narrower than the bottom.

With reference to FIGS. 3-9, and with continuing reference to FIG. 2, the hanger 12 includes a gripper body 24, a cradle body 26, a fastener 28 (e.g., threaded member), such as a screw or bolt, and a stop 30 (e.g., threaded nut, coupling nut, or threaded extended nut).

Figure 5:
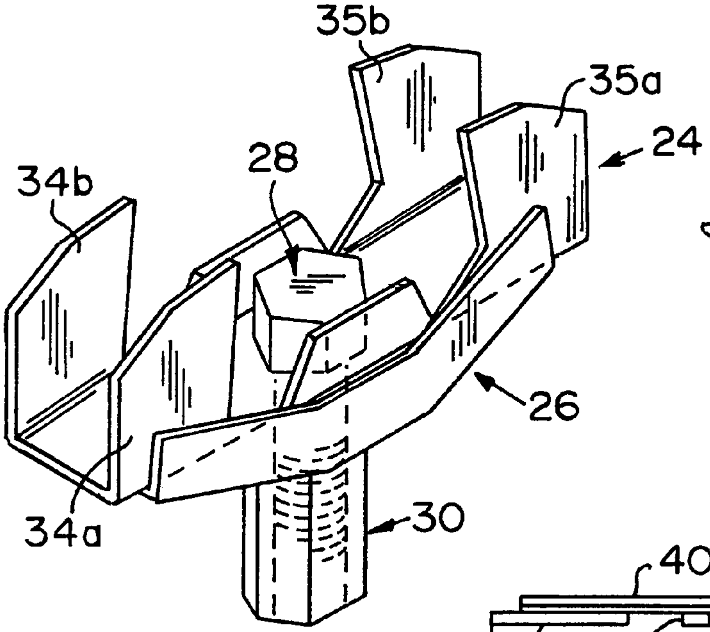
FIG. 5 is a top perspective view of the hanger made in accordance with the present invention.
Figure 3:
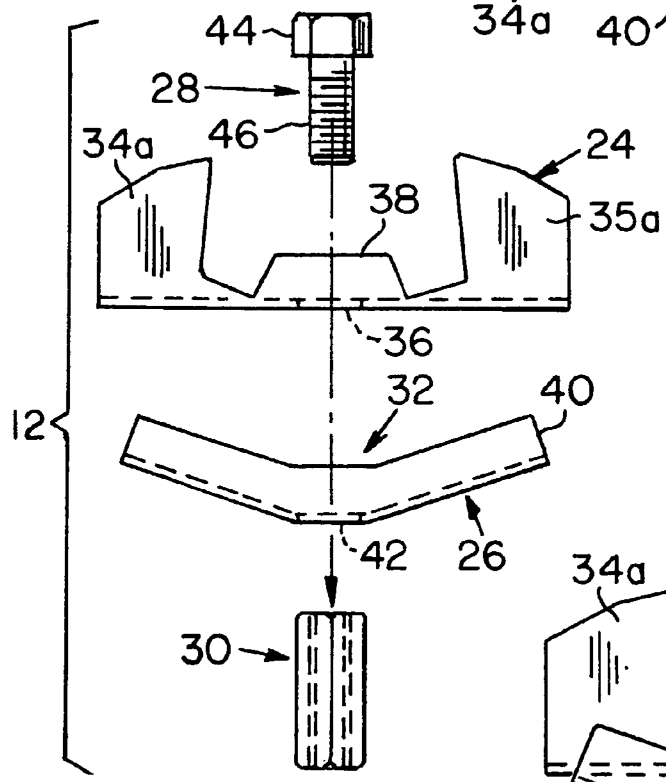
FIG. 3 is an exploded elevational view of the unassembled component pieces of the hanger made in accordance with the present invention.

As shown in FIG. 5, the gripper body 24 includes a plurality of tabs 34*a*, 34*b*, 35*a*, and 35*b*. These tabs extend from the ends of the gripper body 24. Tabs 34*a*, 34*b* are situated on the one end of the gripper body 24 and tabs 35*a*, 35*b* are situated on the other end of the gripper body 24. It is to be understood that the plurality of tabs need not be limited to four in number. For example, as opposed to having two tabs 34*a*, 34*b*, one single tab spanning the width of the ends of the gripper body 24 may be utilized. The set of tabs 34*a*, 34*b* and 35*a*, 35*b* extend upwardly from the gripper body 24 and are angled inwardly toward each other. As shown in FIG. 3, the gripper body 24 includes a centrally situated hole 36 for accommodating the fastener 28 therein. It is to be understood that the hole 36 may be threaded or non-threaded. Additionally, a receiving body 38 is positioned near the hole 36 for preventing the head 44 from rotating. Desirably, the gripper body 24 is constructed of a resiliently deformable material, for example, metal, although it is to be understood that any suitable material may be utilized. The gripper body 24 includes cut-out portions forming bend points X that force the metal to bend along these points, as there is the least amount of resistance in the metal at these points. Alternatively, the metal may have various thicknesses that force the metal to bend at the points of lesser thickness. Generally, any of the above forms of lessened rigidity in the metal allow the gripper body 24 to deform and/or bend. The gripper body 24 may be made of spring steel.

Figure 4:
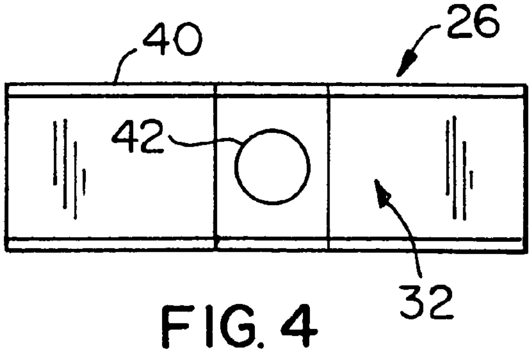
FIG. 4 is a top plan view of a cradle of the hanger made in accordance with the present invention.

Referring to FIG. 4, the cradle body 26 is formed of a unitary piece having a plurality of sidewalls 40 integrated therein. This arrangement forms the gripper body receiving recess 32. The cradle body 26 includes a centrally situated hole 42 for accommodating the fastener 28 therein. Desirably, the cradle body 26 is constructed of metal, although it is to be understood that any suitable material may be utilized. The cradle body 26 should be of such construction that the cradle body 26 maintains a rigid form and is not easily deformed when coacting with the gripper body 24.

Referring to FIG. 3, the fastener 28 may include a polygonal-shaped (e.g., hexagon) head 44 attached to a threaded body 46. The diameter of the threaded body 46 is sized to allow the threaded body 46 to pass through the coaxially aligned hole 36 of the gripper body 24 and the hole 42 of the cradle body 26. It is to be understood that the fastener 28 may embody various configurations when used in conjunction with components of the present invention that also depart from the preferred embodiment design. For example, if the hole 36 of the gripper body 24 is threaded, then fastener 28 may include a threaded top portion in place of the head 44, so that the threaded top portion may be threadably engaged to the threaded hole 36 of the gripper body 24.

Figure 8:
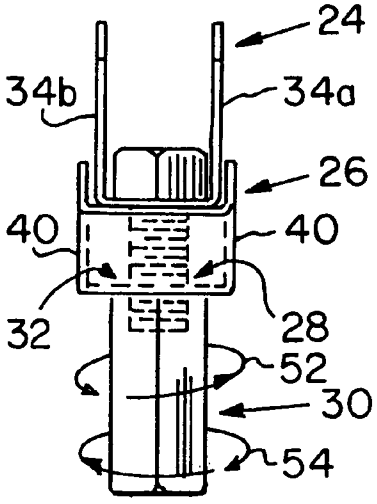
FIG. 8 is a side elevational view of the gripper body and cradle body of FIG. 7 held together by a threaded fastener and a stop made in accordance with the present invention.
Figure 9:
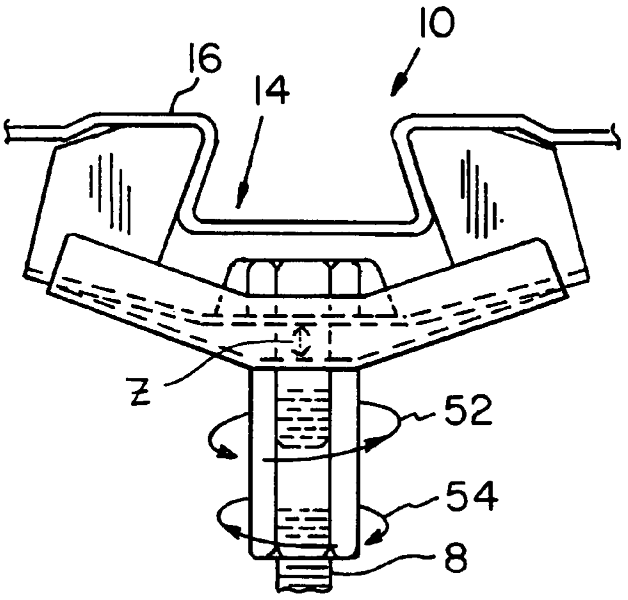
FIG. 9 is a front elevational view of the hanger secured to the external hollow rib chamber with the tabs in an engaged position made in accordance with the present invention.

With reference to FIGS. 8 and 9 and with continuing reference to FIG. 3, the stop 30 includes a threaded throughbore able to receive the threaded body 46 of the fastener 28 and the hanging rod 8.

Figure 7:
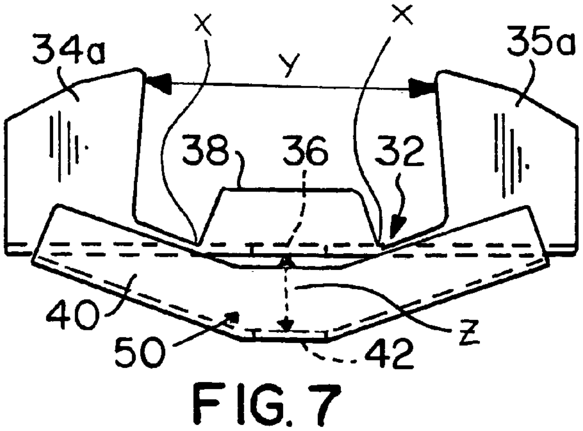
FIG. 7 is a front elevational view of a gripper body within a cradle body of the hanger with tabs in a disengaged position made in accordance with the present invention.

Assembly of the hanger 12 relies on the above-identified component parts, although it is to be understood that the hanger 12 may include additional parts that would not interfere with the objective of the present invention. Due to the component parts, the hanger 12 may be in the form of a kit. As shown in FIG. 3, the assembly of the hanger 12 includes inserting the gripper body 24 into the gripper body receiving recess 32 of the cradle body 26. The threaded body 46 of the threaded fastener 28 is passed through the hole 36 of the gripper body 24 and the hole 42 of the cradle body 26 until the head 44 makes contact with the gripper body 24 and, more specifically, a side surface of the head 44 abuts the receiving body 38. Thus, the receiving body 38 interferes with rotation of the head 44 of the fastener 28, which, in turn, prevents the bolt fastener from rotating. The stop 30 is then threaded onto the threaded body 46 of the fastener 28, thereby securing the cradle body 26 between the gripper body 24 and the stop 30. As shown in FIG. 7, the assembled hanger 12 has the gripper body 24 supported by the outermost portions of the cradle body 26 with a space 50 between the gripper body 24 and cradle body 26. A distance Y between the upper edges of the tabs 34*a*, 34*b*, 35*a*, and 35*b* is such that the distance is sufficient for the tabs 34*a*, 34*b*, 35*a*, and 35*b* to clear the external hollow rib 14.

As shown in FIG. 8, the operation of the hanger 12 requires that the hanger 12 be able to clamp and unclamp depending on whether a movement in a first direction (e.g., clockwise direction to clamp) or movement in a second direction (e.g., counterclockwise direction to unclamp), respectively, is imparted on the stop 30. Thus, with each movement of the stop 30 in the first direction, as indicated by arrow 52, a greater amount of the threaded body 46 of the fastener 28 will be received by the stop 30 and the dimension Z is reduced in size. As shown in FIG. 9, once the stop 30 contacts the cradle body 26 and exerts pressure thereon, the gripper body 24 begins to deform, causing each set of tabs 34*a*, 34*b* and 35*a*, 35*b* to move inwardly and toward each other, coacting with each other to cause the dimension Z to be reduced. This deformation in the gripper body 24 results in the plurality of tabs 34*a*, 34*b*, 35*a*, and 35*b* in conjunction with the gripper body 24 to form an inner profile that substantially corresponds to the shape of an outer profile of the external hollow rib 14. Thus, the distance Y between the tabs 34*a*, 34*b*, 35*a*, and 35*b*, as shown in FIG. 7, decreases. Movement of the stop 30 in the second direction, as indicated by arrow 54, reduces the pressure exerted on the cradle body 26, thereby causing the plurality of tabs 34*a*, 34*b*, 35*a*, and 35*b* to move outwardly and away from each other due to the memory characteristics of the bend points X.

Preferably, the above-discussed hanger 12 is to be used in the hanger system 10, as shown in FIGS. 2 and 9. In operation, the hanger 12 is positioned so that the plurality of tabs 34*a*, 34*b*, 35*a*, and 35*b* is near or adjacent to the external hollow rib 14. Thus, movement of the stop 30 in the first direction causes the plurality of tabs 34*a*, 34*b*, 35*a*, and 35*b* in conjunction with the gripper body 24 to engage the external hollow rib 14, thereby securely attaching the hanger 12 to the external hollow rib 14. After the hanger 12 is secured to the metal decking assembly 16, the hanging rod 8 may be attached to the stop 30, although it is to be understood that the hanger 12 may be installed with the hanging rod 8 already attached to the hanger 12. Thereafter, a load-bearing object (not shown) may be attached to the hanging rod 8 by utilizing any number of attachment means known to those having ordinary skill in the art. The installation process may be reversed in order to remove the hanger 12 from the metal decking assembly 16. Specifically, movement of the stop 30 in the second direction, as indicated by arrow 54, causes the hanger 12 to disengage from the external hollow rib 14.

The ability to disengage the hanger 12 allows one to move, remove, or reuse the hanger 12. Specifically, the hanger 12 may be easily repositioned along the profiled surface of the external hollow rib 14. Additionally, the hanger may be completely removed from the external hollow rib 14 to be reused on a different external hollow rib 14 at a different locale. As previously discussed, the metal decking assembly 16 may utilize variously profiled external hollow ribs 14, such as the angled rib 20 and the arcuate-shaped rib 22 shown in FIGS. 10*a* and 10*b* or any other type ribs having reentrant angles. Accordingly, any hanger that is to be used with these other profiled external hollow ribs is required to have a gripper body and cradle that allow the inner profile of the hanger to assume a substantially corresponding shape of the outer profile of these external hollow ribs. It is to be understood that the operation and use of such hangers would be similar to the operation and use of the hanger 12 as described herein.

Figure 11:
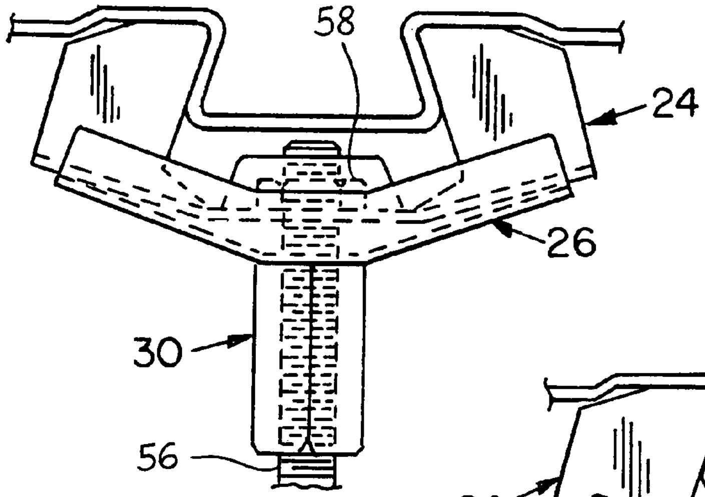
FIG. 11 is a front elevational view of the hanger utilizing an all-thread with a first nut and the stop made in accordance with the present invention.
Figure 12:
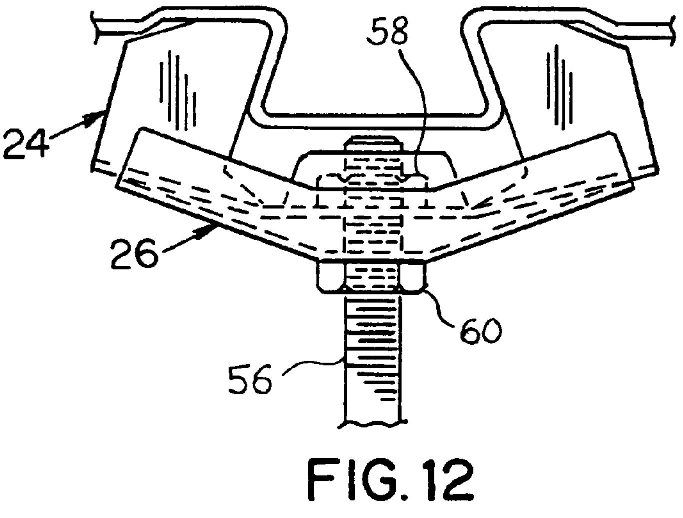
FIG. 12 is a front elevational view of the hanger utilizing the all-thread with the first nut and a second nut made in accordance with the present invention.

With reference to FIGS. 11 and 12, an all-thread 56 may be substituted for the previously shown fastener 28. The all-thread 56 is passed through the hole 36 of the gripper body 24 and the hole 42 of the cradle body 26. Thereafter, a first nut 58 is threaded onto the top of the all-thread 56 until the first nut 58 makes contact with the gripper body 24. Furthermore, a side surface of the first nut 58 abuts the receiving body 38 to prevent the first nut 58 from moving. The stop 30 may then be threaded onto the bottom of the all-thread 56, thereby securing the cradle body 26 between the gripper body 24 and the stop 30. A second nut 60 may be threaded onto the bottom of the all-thread 56 as a substitution for the stop 30.

Figure 6:
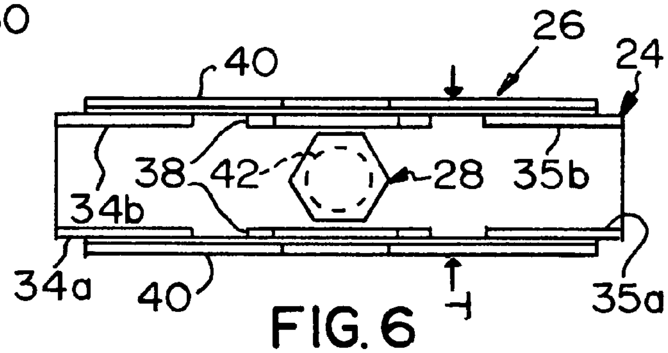
FIG. 6 is a top plan view of the hanger made in accordance with the present invention.
Figure 13:
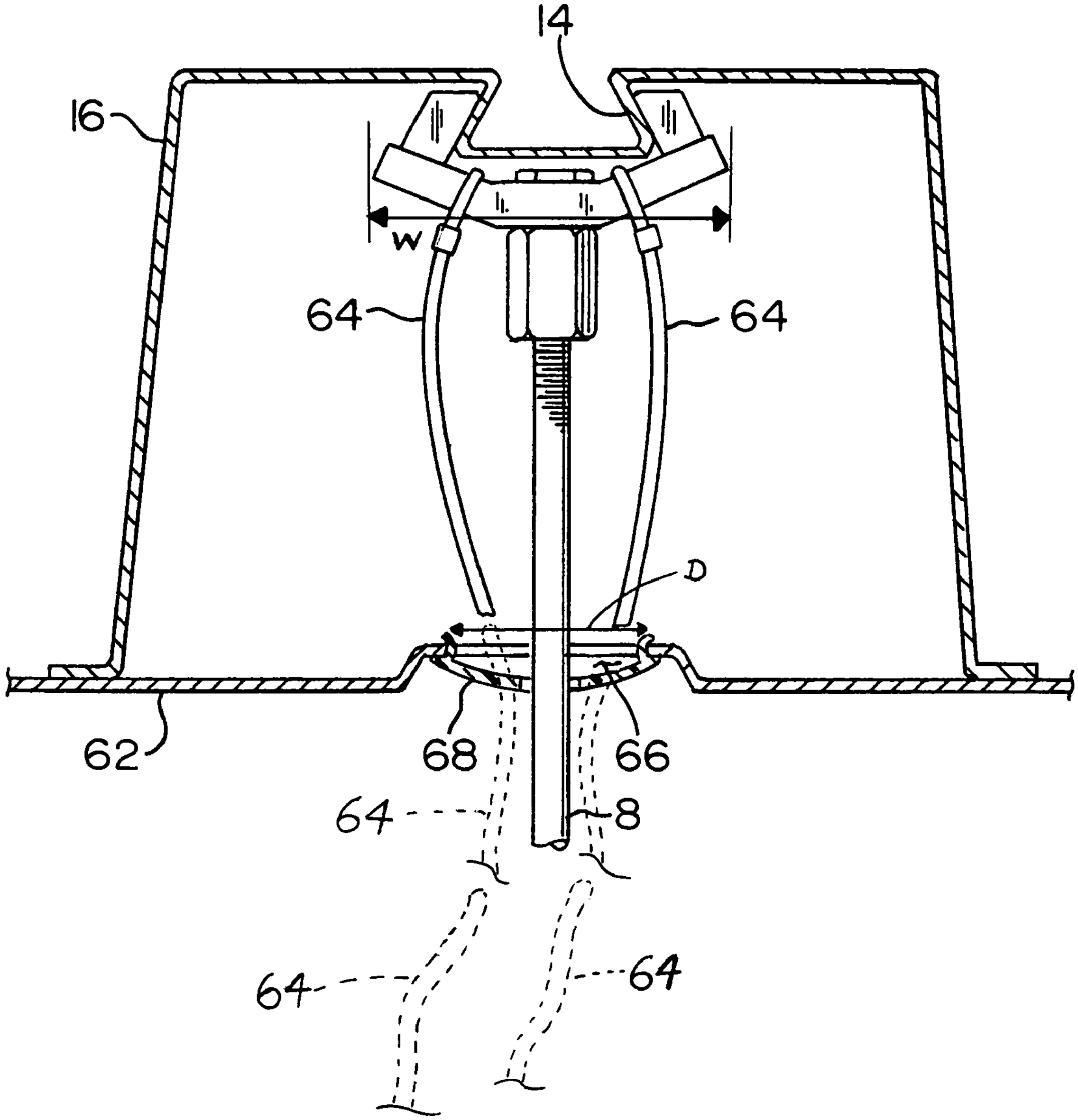
FIG. 13 is a front elevational view of the hanger having ties secured thereto.

With reference to FIG. 13, the metal decking assembly 16 is shown incorporating a deck plate 62. The hanger 12 utilized in this deck application includes ties 64 that are secured around the left and right portions of the cradle body 26. The ties 64 may be locking plastic ties or other suitable ties. The deck plate 62 includes a hole 66 for accommodating the hanger 12 therethrough. The diameter D of the hole 66 may be less than the width W of the hanger 12 at its widest portion. However, the thickness T of the hanger (as shown in FIG. 6) is less than the diameter of the hole 66. Thus, the hanger 12 needs to be angled for insertion through the hole 66. The hanger 12 is then seated against the inside of the deck plate 62 and the ties 64 extend through the hole 66, as shown in phantom. Thereafter, the ties 64 may be grasped to center the hanger 12 in line with the external hollow rib 14 above it. The hanger 12 is then pushed up against the external hollow rib 14 by the hanging rod 8 or the all-thread 56 and is then secured thereto, as previously described. Alternatively, a nut driver (not shown) can be passed through the hole 66 and can be used to install the hanger 12 on the external hollow rib 14; then the hanging rod 8 may be attached to the nut. It is to be understood that the ties 64 do not interfere with the functioning of the hanger 12. After insertion of the hanging rod 8, a snap plug 68 may then be fitted over the hole 66. The ties 64 may then be stowed in the area bounded by the metal deck assembly defined by reference numerals 16 and 62 prior to placement of the snap plug 68. The ties 64 may also be used to facilitate easy removal of the hanger 12 through the hole 66.

Figure 14:
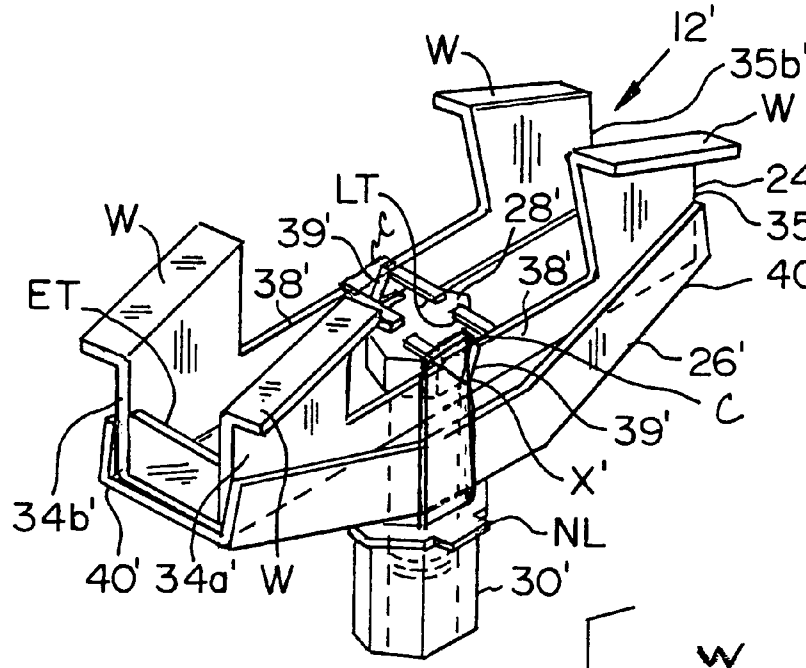
FIG. 14 is a top perspective view of another embodiment of a hanger made in accordance with the present invention.
Figure 15:
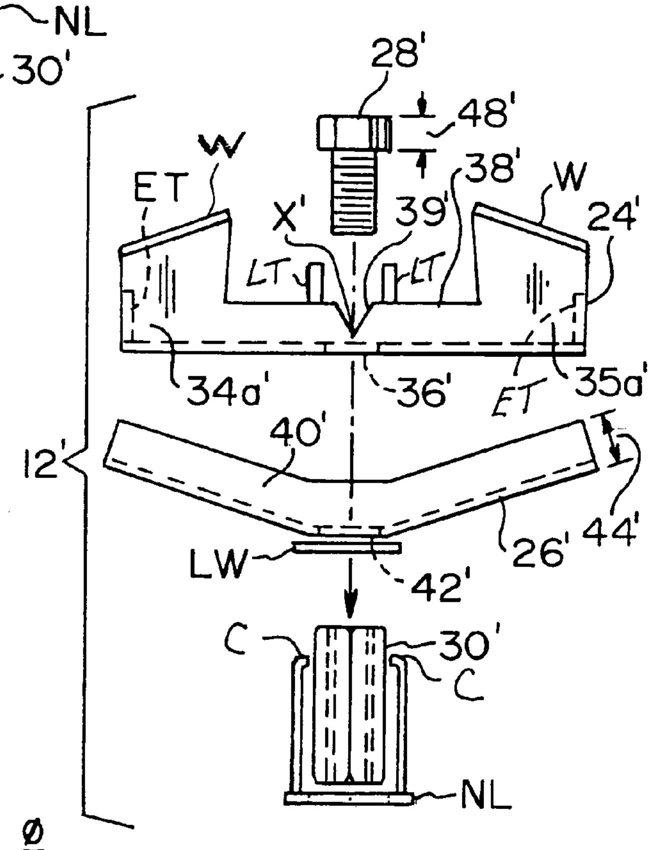
FIG. 15 is an exploded elevational view of the unassembled component pieces of the hanger shown in FIG. 14.
Figure 16:
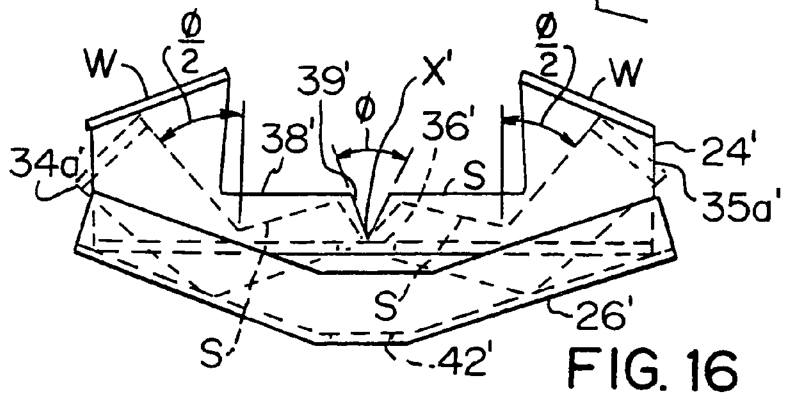
FIG. 16 is a front elevational view of the gripper body within a cradle body of the hanger shown in FIG. 14 in a disengaged position.

FIGS. 14-16 show another embodiment of a hanger 12' that is similar to the hanger 12 and functions the same way as the hanger 12 in the hanger system 10.

The hanger 12' includes a gripper body 24', a cradle body 26', a fastener 28', and a stop 30'. The fastener 28' and the stop 30' are the same as fastener 28 and stop 30.

The gripper body 24' is similar to gripper body 24, and includes a plurality of tabs 34*a*', 34*b*', 35*a*' and 35*b*'. The gripper includes a centrally situated hole 36'. Receiving bodies 38' are positioned near the hole 36' for preventing the head 44' from rotating. A V-shaped notch 39' is defined at a mid-portion of each of the bodies 38'. A bend point X' is defined at the base of each notch 39'. Wings W are defined at ends of tabs 34*a*', 34*b*', 35*a*' and 35*b*' and depend therefrom, and prevent buckling of the tabs 34*a*', 34*b*', 35*a*' and 35*b*' when high loads are applied to the hanger 12'. End tabs ET are also provided and positioned between adjacent tabs 34*a*', 34*b*' and 35*a*', 35*b*'. Lock tabs LT may be provided to lock the fastener 28' in place. Lock tabs LT extend from bodies 38' initially in an unbent position as shown in FIG. 15. After the fastener 28' is passed through the hole 36', the lock tabs LT are bent approximately 90 degrees to prevent the fastener 28' from being removed from the gripper body 24'. In lieu of the locking tabs LT, a lock washer LW or a push nut bolt retainer, which is fixedly attached to the threaded portion of the fastener 28' in a manner well-known in the art, may be used to hold the fastener 28' in place with the gripper body 24' and the cradle 26'. Also, a nut lock NL may be provided to capture over the stop 30' and engages via clips C to receiving bodies 38' to prevent further rotation of the stop 30' once the hanger 12' is engaged. The lock tab LT, lock washer LW and the nut lock NL may be used with any embodiment of the present invention.

The cradle body 26' is similar to cradle body 26, and is formed of a unitary piece having a plurality of sidewalls 40' integrated therein. This arrangement forms the gripper body receiving recess 32'. The cradle body 26' includes a centrally situated hole 42' for accommodating the fastener 28' therein. The length of the cradle 26' is substantially the same length as the gripper body 24'. Further, the depth 44' of the sidewalls 40' is approximately equal to the thickness 48'. The operation of the hanger 12' is substantially the same as the hanger 12, except instead of the gripper body 24 bending along bend points X, the gripper body 24' bends along bend point X' during clamping and unclamping. Further, as shown in phantom in FIG. 16, in the unclamped state, the portions of the bodies 38' may be angled an angle $\theta/2$ and the sides of each notch 39' define an angle $\theta$ so that when the hanger 12' is moved to the clamped position, angle $\theta$ decreases and the angle $\theta/2$ decreases so that upper surfaces S of the bodies 38' move to a less angled arrangement. The hanger 12' can include ties 64.

The present invention has been described with reference to the preferred embodiments. Obvious modifications, combinations, and alterations will occur to others upon reading the preceding detailed description. It is intended that the invention be construed as including all such modifications, combinations, and alterations insofar as they come within the scope of the appended claims or the equivalents thereof.

The invention claimed is:

1. A hanger for attaching a load-bearing object to a rib, said hanger comprising:

a gripper having a gripper body, said gripper body extending along a longitudinal axis and having a plurality of tabs depending therefrom and spaced along the longitudinal axis, each of said tabs having an outer face portion and an inner edge portion, said plurality of tabs spaced apart from each other along a lateral axis forming a U-shaped portion extending along the longitudinal axis, said gripper body configured to be deformable;

a cradle having a cradle body, said cradle body extending along the longitudinal axis and including sidewall portions spaced apart along the lateral axis defining a U-shaped gripper body receiving recess for receiving said gripper body, said gripper body received within said gripper body receiving recess such that at least a portion of said sidewall portions abuts at least a portion of said outer face portions of said tab members, said cradle configured to be rigid relative to the gripper body;

a threaded member passing through said cradle body and said gripper body; and a stop secured to said threaded member, wherein said cradle is positioned between said gripper and said stop, said stop being located at a location adjacent to and in direct contact with said cradle, said threaded member coacting with said gripper and said cradle, whereby movement of said stop in a first direction exerts pressure on the cradle body to cause said cradle body and said sidewall portions to coact with the gripper body causing said gripper body to deform and said inner side portions of said plurality of tabs to move toward each other about the lateral axis.

2. The hanger of claim 1, wherein said treaded member is a fastener, said fastener having a first end and a second end, wherein said first end of said fastener comprises a head and wherein said second end of said fastener is threadably engaged to said stop.

3. The hanger of claim 1, wherein said threaded member is a fastener, said fastener having a first end and a second end, wherein said first end of said fastener is threadably engaged to said gripper body and said second end of said fastener is threadably engaged to said stop.

4. The hanger of claim 1, wherein said threaded member is an all-thread, said all-thread having a first portion and a second portion, wherein said first portion of said all-thread is threadably engaged to a first nut and said second portion of said all-thread is threadably engaged to said stop.

5. The hanger of claim 4, wherein said stop is a second nut.

6. The hanger of claim 2, further comprising a receiving body integral with said gripper body, said receiving body abutting at least one surface of said head of said fastener to prevent rotation of said head.

7. The hanger of claim 2, wherein said stop secures said cradle body between said gripper body and said stop.

8. The hanger of claim 2, wherein said stop is adapted to receive a hanging rod.

9. The hanger of claim 2, wherein movement of said stop in a second direction allows said plurality of tabs of said gripper to be moved away from each other.

10. The hanger of claim 2, wherein an inner profile formed by said plurality of tabs is adapted to substantially correspond to a shape of an outer profile of a rib, so that said hanger may be securely attached to the outer profile of the rib.

11. The hanger of claim 10, further comprising ties secured around the cradle body, said ties adapted for use in aligning the hanger with the rib.

12. The hanger of claim 10, wherein said rib is dovetail shaped.

13. The hanger of claim 1, wherein said gripper body comprises metal.

14. A hanger system comprising:

a deck having an external member extending downwardly therefrom, said external member having a profiled surface;

a hanger for attachment to said external member, said hanger including:

(a) a gripper having a gripper body, said gripper body extending along a longitudinal axis and having a plurality of tabs depending therefrom and spaced along the longitudinal axis, each of said tabs having an outer face portion and an inner edge portion said plurality of tabs spaced apart from each other along a lateral axis forming a U-shaped portion extending along the longitudinal axis, said gripper body configured to be deformable;

(b) a cradle having a cradle body, said cradle body extending along the longitudinal axis and including sidewall portions spaced apart along the lateral axis defining a U-shaped gripper body receiving recess for receiving said gripper body, said gripper body received within said gripper body receiving recess such that at least a portion of said sidewall portions abuts at least a portion of said outer face portions of said tab members, said cradle configured to be rigid relative to the gripper body;

(c) a threaded member passing through said cradle body and said gripper body; and (d) a stop threadably secured to said threaded member, wherein said cradle is positioned between said gripper and said stop, said stop being located at a location adjacent to and in direct contact with said cradle, said threaded member coacting with said gripper and said cradle, whereby movement of said stop in a first direction exerts pressure on the cradle body to cause said cradle body and said sidewall portions to coact with said gripper body causing said gripper body to deform and said inner side portions of said plurality of tabs to move toward each other about the lateral axis.

15. The hanger system of claim 14, wherein said plurality of tabs securely engages said profiled surface of said external member.

16. The hanger system of claim 14, wherein said external member includes reentrant surfaces coacting with the plurality of tabs.

17. The hanger system of claim 14, wherein said profiled surface of said external member is dovetail shaped.

18. The hanger system of claim 14, wherein said threaded member is a fastener, said fastener having a first end and a second end, wherein said first end of said fastener comprises a head and wherein said second end of said fastener is threadably engaged to said stop.

19. The hanger system of claim 14, wherein said stop secures said cradle body between said gripper body and said stop.

20. The hanger system of claim 14, wherein said stop is adapted to receive a hanging rod.

21. The hanger system of claim 14, wherein movement of said stop in a second direction allows said plurality of tabs of said gripper to be moved away from each other.

22. A method of attaching a load-bearing object to a rib, the method comprising the steps of:

(a) providing a deck having an external member extending downwardly therefrom, said external member having a profiled surface;

(b) providing a hanger, wherein said hanger includes:

(i) a gripper having a gripper body, said gripper body extending along a longitudinal axis and having a plurality of tabs depending therefrom and spaced along said longitudinal axis, each of said tabs having an outer face portion and an inner edge portion said plurality of tabs spaced apart from each other along a lateral axis forming a U-shaped portion extending along the longitudinal axis, said gripper body configured to be deformable;

(ii) a cradle having a cradle body, said cradle body extending along the longitudinal axis and including sidewall portions spaced apart along the lateral axis defining a U-shaped gripper body receiving recess for receiving said gripper body, said gripper body received within said gripper body receiving recess such that at least a portion of said sidewall portions abuts at least a portion of said outer face portions of said tab members, said cradle configured to be rigid relative to the gripper body, (iii) a threaded member passing through said cradle body and said gripper body, and (iv) a stop threadably secured to said threaded member, wherein said cradle is positioned between said gripper and said stop, said stop being located at a location adjacent to and in direct contact with said cradle, said threaded member coacting with said gripper and said cradle;

(c) positioning said hanger near said external member, so that said plurality of tabs are proximate to said profiled surface of said external member;

(d) moving said stop in a first direction to exert pressure on the cradle body to cause said cradle body and said sidewall portions to coact with said gripper body causing said gripper body to deform and said inner side portions of said plurality of tabs to move toward each other about the lateral axis and securely engage said profiled surface of said external member; and (e) attaching said load-bearing object to said hanger.

23. A kit for attaching a load-bearing object to a rib, comprising:

(a) a threaded member having a first end and a second end;

(b) a gripper having a body, said body extending along a longitudinal axis and having a plurality of tabs depending therefrom and spaced along the longitudinal axis, each of said tabs having an outer face portion and an inner edge portion, said plurality of tabs spaced apart from each other along a lateral axis forming a U-shaped portion extending along the longitudinal axis, said gripper body configured to be deformable and being adapted to receive said first end of said threaded member;

(c) a cradle having a cradle body, said cradle body extending along the longitudinal axis and including sidewall portions spaced apart along the lateral axis defining a U-shaped gripper body receiving recess for receiving said gripper body such that at least a portion of said sidewall portions abuts at least a portion of said outer face portions of said tab members, said cradle configured to be rigid relative to the gripper body, said cradle body adapted to receive said first end of said threaded member; and (d) a stop located adjacent to and in direct contact with said cradle and adapted to receive said second end of said threaded member such that movement of said stop in a first direction exerts pressure on the cradle body to cause said cradle body and said sidewall portions to coact with the gripper body causing said gripper body to deform and said inner side portions of said plurality of tabs to move toward each other about the lateral axis.

24. The kit of claim 23, wherein the threaded member is a fastener.

25. The hanger system of claim 14, further comprising ties secured around the cradle body for use in aligning the hanger with the rib.

26. The hanger of claim 1, wherein each of said tabs includes a wing depending therefrom.

27. The hanger system of claim 14, wherein each of said tabs includes a wing depending therefrom.

28. The hanger system of claim 1, wherein said gripper body has at least one bend point.

29. The hanger system of claim 14, wherein said gripper body has at least one bend point.

30. A hanger as claimed in claim 1, further comprising a lock member coacting with the stop to prevent rotation thereof.

31. A hanger as claimed in claim 1, further comprising a lock for preventing removal of said threaded member from said gripper.

32. A hanger as claimed in claim 30, further comprising a lock for preventing removal of said threaded member from said gripper.

33. The hanger of claim 1, wherein the gripper, cradle and stop are positioned adjacent to one another and adjacent to an outer surface of said rib.

* * * * *

UNITED STATES PATENT AND TRADEMARK OFFICE

CERTIFICATE OF CORRECTION

PATENT NO. : 7,603,814 B1
APPLICATION NO. : 10/857537
DATED : October 20, 2009
INVENTOR(S) : Hartmann et al.

It is certified that error appears in the above-identified patent and that said Letters Patent is hereby corrected as shown below:

Column 7, Line 26, Claim 2, "treaded member" should read -- threaded member --

Signed and Sealed this

Twenty-third Day of February, 2010

David J. Kappos

David J. Kappos
*Director of the United States Patent and Trademark Office*

UNITED STATES PATENT AND TRADEMARK OFFICE

CERTIFICATE OF CORRECTION

PATENT NO. : 7,603,814 B1
APPLICATION NO. : 10/857537
DATED : October 20, 2009
INVENTOR(S) : Hartmann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1069 days.

Signed and Sealed this

Fifth Day of October, 2010

David J. Kappos

*Director of the United States Patent and Trademark Office*